(12) United States Patent
Wu et al.

(10) Patent No.: US 7,618,520 B2
(45) Date of Patent: Nov. 17, 2009

(54) PHYSICAL VAPOR DEPOSITION TARGET CONSTRUCTIONS

(75) Inventors: Chi tse Wu, Veradale, WA (US);
Stephane Ferrasse, Veradale, WA (US);
Frank C. Alford, Veradale, WA (US);
Susanne Grabmeier, Munich (DE);
Werner H. Hort, Cranberry, PA (US);
Jaeyeon Kim, Liberty Lake, WA (US);
Susan D. Strothers, Spokane, WA (US);
Andrew Wragg, Cheshire (GB); Robert Prater, Los Altos, CA (US)

(73) Assignee: Honeywell International Inc., Morristown, NJ (US)

( * ) Notice: Subject to any disclaimer, the term of this patent is extended or adjusted under 35 U.S.C. 154(b) by 499 days.

(21) Appl. No.: 11/234,615

(22) Filed: Sep. 23, 2005

(65) Prior Publication Data

US 2006/0070876 A1 Apr. 6, 2006

Related U.S. Application Data

(63) Continuation-in-part of application No. PCT/US2005/003437, filed on Feb. 2, 2005.

(60) Provisional application No. 60/541,665, filed on Feb. 3, 2004.

(51) Int. Cl.
C23C 14/35 (2006.01)

(52) U.S. Cl. .............................. 204/298.12; 204/298.13

(58) Field of Classification Search ............ 204/298.12, 204/298.13
See application file for complete search history.

(56) References Cited

U.S. PATENT DOCUMENTS

| | | | | |
|---|---|---|---|---|
| 5,658,442 A * | 8/1997 | Van Gogh et al. | ...... | 204/298.12 |
| 5,935,397 A | 8/1999 | Masterson | | |
| 6,149,776 A * | 11/2000 | Tang et al. | ............. | 204/192.12 |
| 6,416,634 B1 * | 7/2002 | Mostovoy et al. | ...... | 204/192.12 |
| 6,471,836 B2 * | 10/2002 | Okuda et al. | ........... | 204/298.11 |
| 2002/0162741 A1 * | 11/2002 | Gogh | ..................... | 204/298.12 |

FOREIGN PATENT DOCUMENTS

| | | |
|---|---|---|
| EP | 0780487 A1 | 6/1997 |
| WO | 96/36065 | 11/1996 |

* cited by examiner

*Primary Examiner*—Rodney G McDonald

(57) ABSTRACT

The invention includes a target construction having a sputtering region and a flange region laterally outward relative to the sputtering region. The flange region has a front surface disposed on a front face of the construction and a back surface opposing the front surface. An o-ring groove is disposed within the flange region. The o-ring groove has a planar base surface which has a first width and has an orifice disposed along the front surface of the flange. The orifice has a second width as measured parallel relative to the base surface. The second width is greater than the first width. The flange surfaces can additionally be protected from rubbing by a layer of protective material.

17 Claims, 13 Drawing Sheets

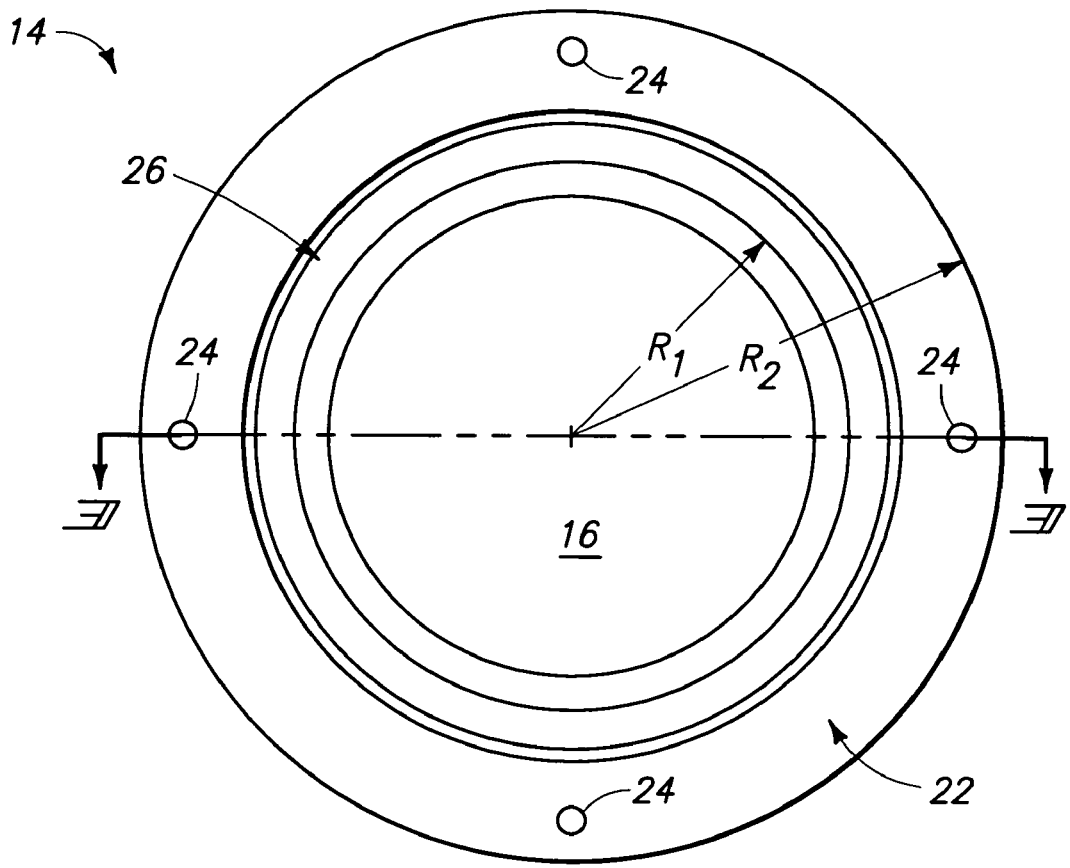
_Fig 2_
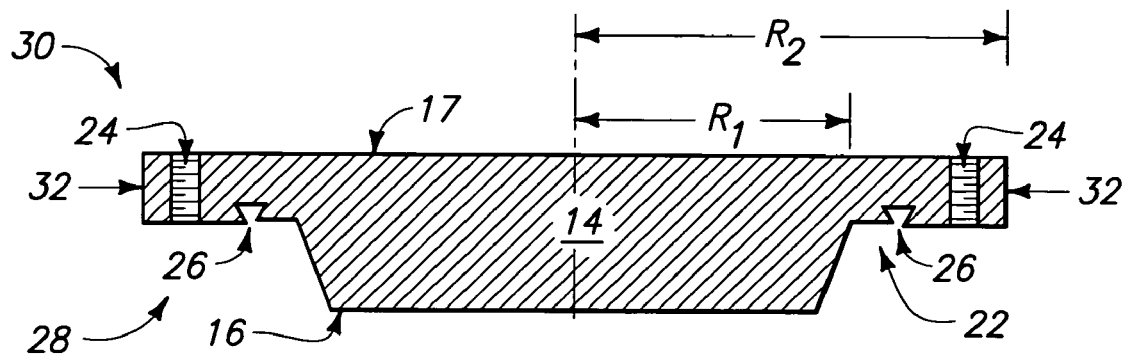
_Fig 3_

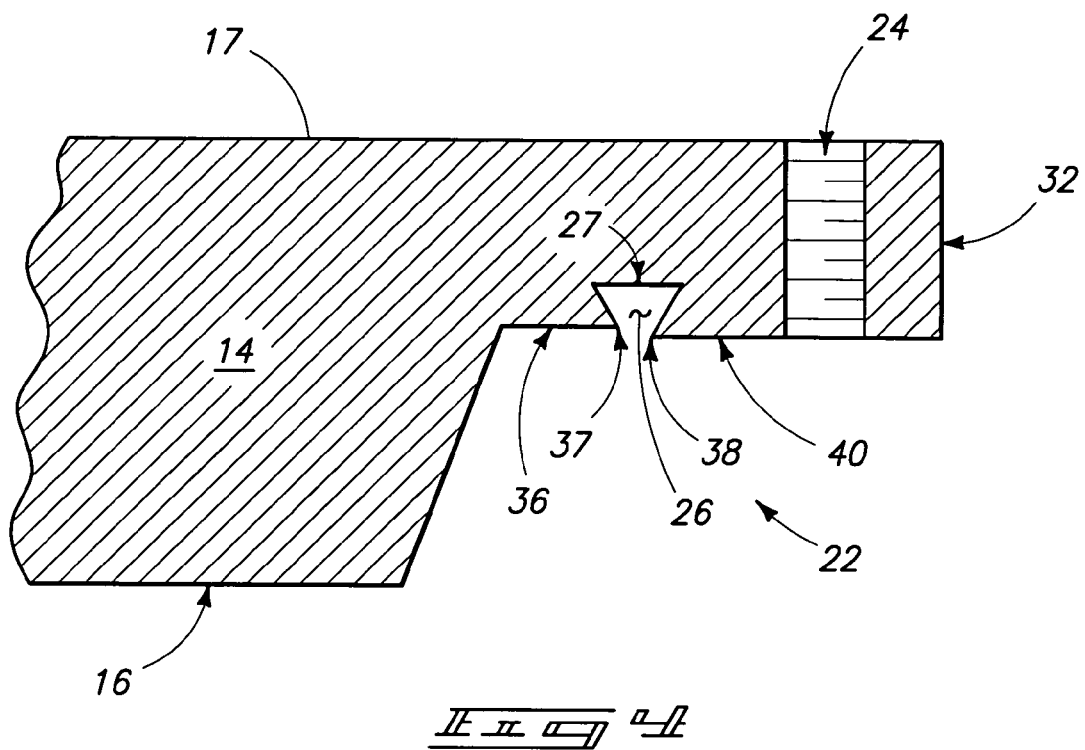
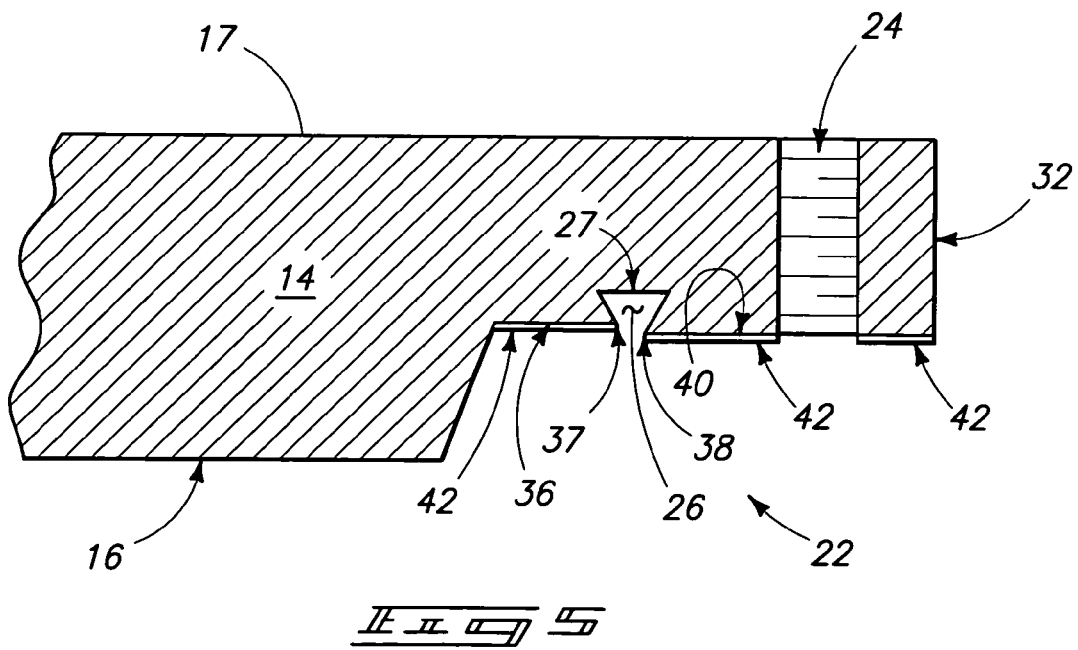

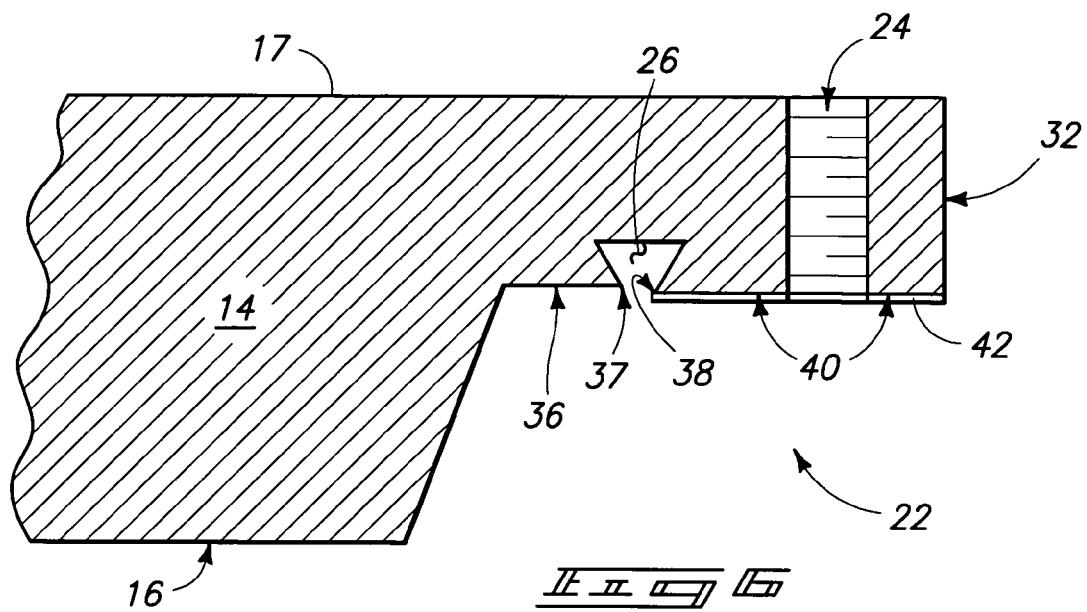
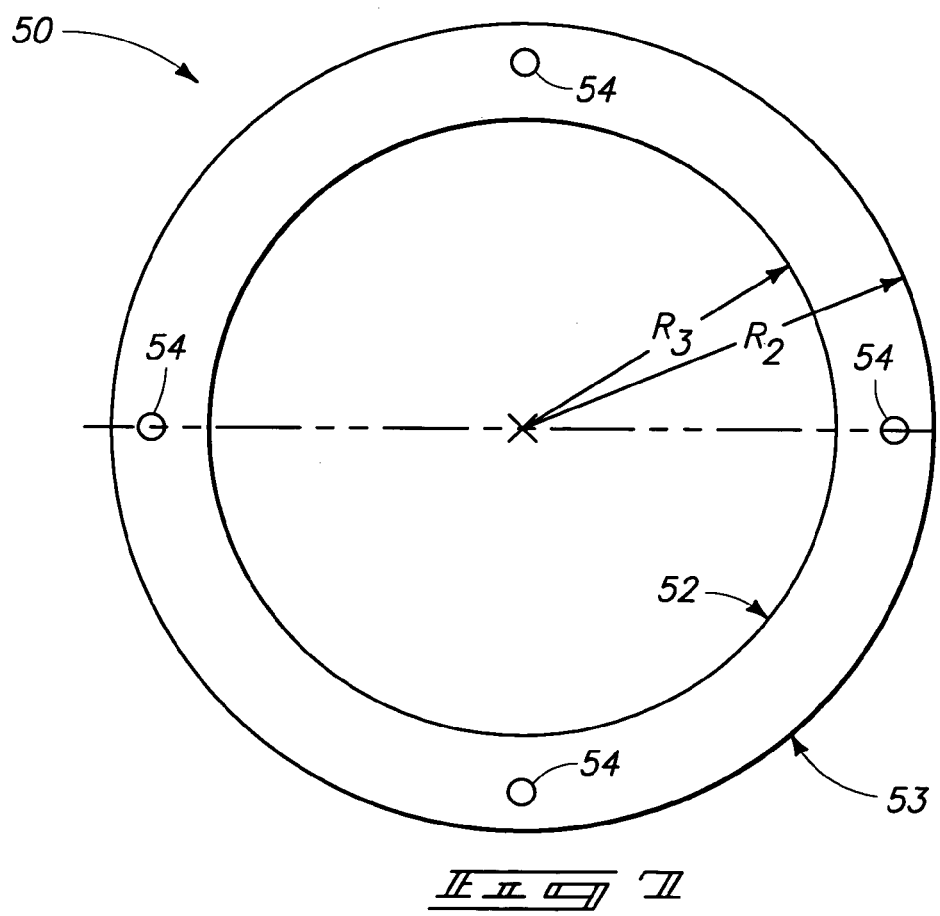

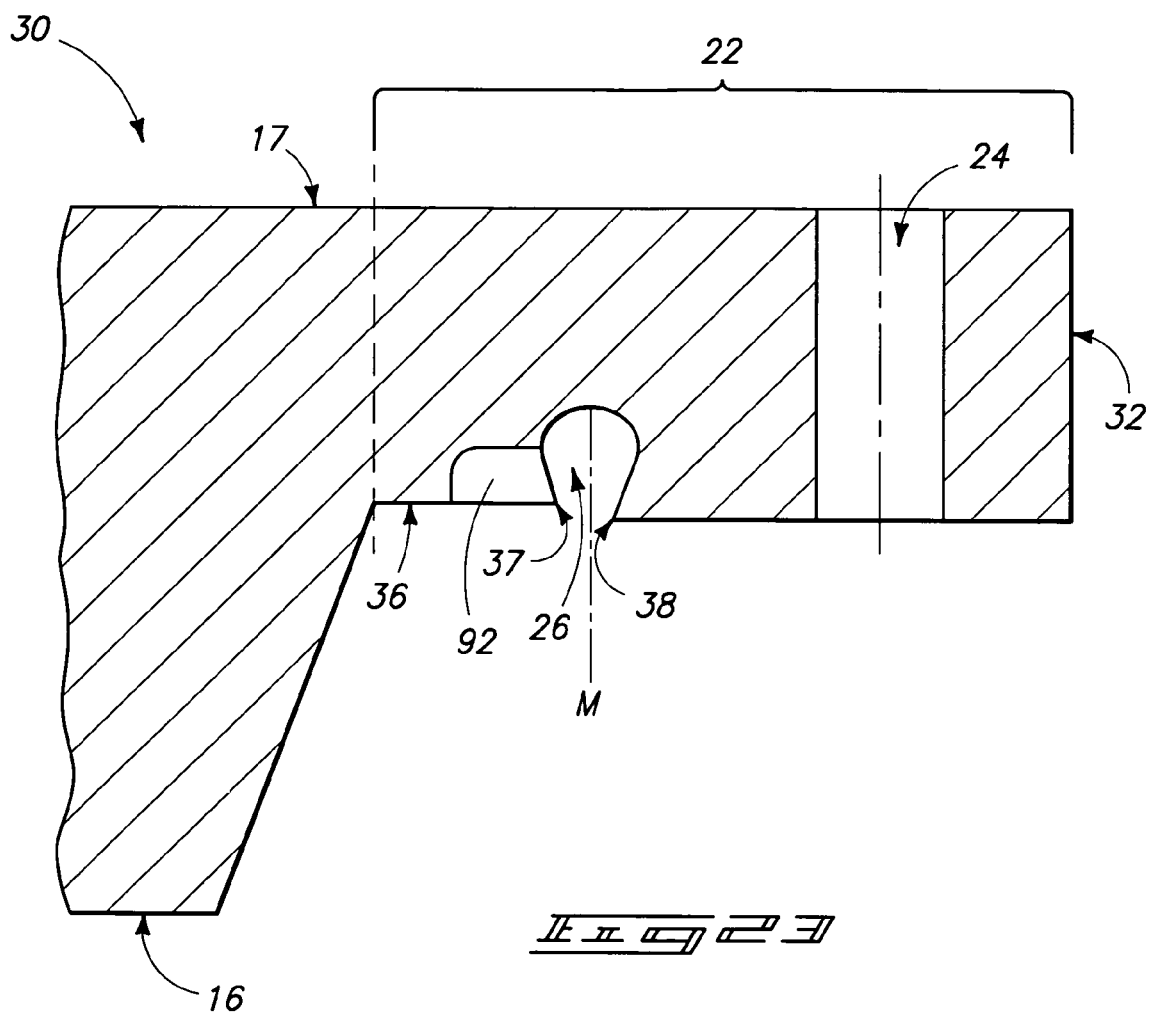

PHYSICAL VAPOR DEPOSITION TARGET CONSTRUCTIONS

RELATED PATENT DATA

This patent is a continuation-in part which claims priority under 35 U.S.C. § 365(c) to PCT/US2005/003437 filed Feb. 2, 2005, which claims priority to U.S. Provisional Application Ser. No. 60/541,665, filed Feb. 3, 2004.

TECHNICAL FIELD

The invention pertains to physical vapor deposition target constructions.

BACKGROUND OF THE INVENTION

Physical vapor deposition (PVD) is commonly utilized for forming thin layers of material across a variety of substrates, including but not limited to, semiconductor substrates. FIG. 1 diagrammatically illustrates a PVD process. An exemplary PVD system 10 is shown having a substrate 12 positioned proximate a PVD target 14 (also referred to as a sputtering target). System 10 can utilize a monolithic target construction such as target 14 depicted, where monolithic indicates the target is machined or fabricated from a single piece of material and is used without combination with a target backing plate. Alternatively, a target construction can be a target assembly comprising a target and a backing plate (discussed further below). System 10 is not limited to a particular type of system or apparatus. Target 14 or an alternative target/backing plate assembly can have any of a number of configurations suitable for retaining the target within a desired sputtering apparatus.

Target 14 can comprise any suitable composition, and in the shown application comprises a conductive material. It is to be understood that the target can comprise any suitable construction for forming a desired film, and accordingly can also comprise non-conductive materials, such as for example, ceramic materials.

An exposed surface 16 of target 14 can be referred to as a sputtering surface. During a sputtering event, high energy particles generated by an RF plasma, for example, are impinged upon surface 16. The impingement causes displacement of material from target 14. The released material is diagrammatically illustrated by arrows 18. The released material forms a thin film 20 across an upper surface of substrate 12.

For purposes of the present description, the side of target 14 which includes sputtering surface 16 can be referred to as a front side of the target. Similarly, an opposing target surface 17 can be referred to as being on the back side of target 14.

During a sputtering process, substrate 12 is typically placed at a defined distance opposite surface 16 of target 14 which is mounted within a sputtering apparatus (not shown). When a target such as target 14, shown in FIG. 1, or alternatively a target/backing plate assembly is mounted within a PVD chamber, a portion of one or more surfaces of the target and/or backing plate can be in contact with interfacing surfaces of the PVD apparatus.

Referring to FIG. 2, a monolithic target is shown which has a sputtering surface 16 encircled by a mounting flange region 22. Target 14 is configured for mounting by providing mounting holes 24. Mounting holes 24 can in some instances be threaded for mounting using mounting bolts. Flange region 22 can comprise four holes as shown or can comprise any number of mounting holes as appropriate for the particular mounting configuration of the PVD system being utilized. Alternatively, target 14 can be mounted using a clamping or alternative configuration where holes 24 are not utilized and accordingly, flange region 22 can be configured to lack any holes (not shown).

Referring to FIG. 3, such shows a sectional side view of the target 14 taken along line 3-3 of FIG. 2. Mounting holes 24 can extend from a front side of target 28 through the flange region to backside 30. As discussed above, the number and placement of mounting poles 24 can vary depending upon the target mounting configuration of the system. Accordingly, the relative distance of placement of mounting holes 24 from target edge 32 can vary from that shown in FIG. 3.

As shown at each of FIGS. 2 and 3, target 14 has an inner radius $R_1$ associated with the radius of the sputtering portion of the target, and an overall radius $R_2$ which extends from a central axis designated 'C', to perimeter surface 32 and is inclusive of flange region 22 as well as the sputtering portion of the target. Target 14 can comprise an o-ring groove 26 (also referred to as a channel or gland) within flange region 22. In particular mounting configurations, o-ring channel 26 will be present as an opening in the front side of flange region 22. It is to be understood that the invention encompasses targets having alternative placement of o-ring channel 26, such as for example, at a distance from target edge 32 that differs from the placement shown in FIGS. 2 and 3.

Upon mounting within a sputtering apparatus, portions of flange region 22 can typically contact one or more interfacing surfaces of the deposition apparatus. Referring to FIG. 4, such shows an enlarged view of an exemplary flange region of a sputtering target. In a typical mounting configuration, at least a portion of the front surface of flange region 22 can interface a ceramic ring disposed between the target and the wall of the sputtering apparatus. An o-ring (not shown) is placed within o-ring channel 26 and upon mounting. Such o-ring contacts and preferably forms a seal between the flange region and the ceramic ring or other contacting surface.

Often, conventional targets show visible signs of rubbing of at least some of the surfaces on the front side of flange region 22 upon use of the target. Rubbing between the target surfaces can result in damage to the target and/or interfacing surfaces and can produce particles which can contaminate resulting films.

In conventional target design such as that exemplified in FIG. 4, an inner flange surface 36 extending from an inner groove corner 37 toward the sputtering region of the target is somewhat recessed relative to more outwardly disposed surfaces such as surface 40 which extends from an outer corner 38 of o-ring groove 26 toward mounting hole 24. It is noted that the amount of surface recess or offset between parallel surfaces 36 and 40 in a conventional target is not limited to a particular value and can be, for example, about 0.01 inches. In such target configurations, rubbing, scarring and/or scoring can occur primarily at corner 38 and/or across portions of surface 40.

Rubbing of the mounted target against the ceramic ring can be due to a number of factors. Upon impingement of high energy particles during a sputtering cycle, a portion of the energy of the particles is dissipated as thermal energy into the target material. Accordingly the temperature of target 14 increases during the sputtering process. Some PVD systems are configured to remove some of the thermal energy from the backside of the target or target/backing plate assembly utilizing a cooling circuit which typically comprises a water flow. As a result the entire target is at an elevated temperature during deposition with the target face being considerably hotter than the backside of the target. The temperature differential in the target leads to varied amounts of thermal expansion throughout the target and can result in motion. Such movement of the target can be enhanced in systems where pressurized water cooling is utilized on the backside and a vacuum is present at the opposing sputtering surface.

The mounting of the target and in certain instances the weight of the cooling fluid used in the cooling system can lead to severe o-ring deformation allowing increased contact between surfaces of the flange region and inner facing surfaces of the apparatus. The resulting rubbing can lead to contamination of the target by ceramic material and damage to the ceramic ring as well as the target. Contamination of the target can in turn lead to contamination of deposited layers thereby decreasing the quality of the layers. These negative effects can be intensified where larger targets or target assemblies are utilized.

In addition to the rubbing problems discussed above, target surface damage and/or contamination can occur due to arcing. Arcing can occur, for example, when gas or moisture becomes trapped within the o-ring groove during target mounting. Escape of such trapped gas or moisture during a deposition event can result in arcing resulting in damage to flange surfaces, target surfaces and/or ceramic ring surfaces which can in turn result in contamination of deposited layers. Another factor that may contribute to arching is the proximity of the groove vent relative to shielding present in the PVD chamber.

It is desirable to develop target constructions and methods for reducing target motion and rubbing that occurs in PVD processes.

SUMMARY OF THE INVENTION

In one aspect the invention encompasses a target construction including a sputtering region having a sputtering surface disposed on a front face of the construction, and a flange region laterally outward relative to the sputtering region. The flange region has a front surface extending from the sputtering region to an outer edge of the construction. A protective layer is present over at least a portion of the front surface.

In one aspect the invention encompasses a sputtering target construction having a flange region laterally outward relative to a sputtering region. The flange region has a front surface extending from the sputtering region to an outer edge of the target construction. The flange region comprises a planar portion of the front surface which defines a first elevation and a groove disposed within the front surface separated from the sputtering region by at least the planar portion. A sloped portion of the front surface is disposed laterally outward from the groove relative to the planar portion, the slope portion being angled relative to the planar portion.

In one aspect the invention encompasses a target construction having an o-ring groove disposed within a flange region. The o-ring channel has a base surface, an orifice, a first sidewall extending from the base surface to the orifice, and a second sidewall opposing the first sidewall. A first corner angle within the channel is defined by the first sidewall and the base surface. A second corner angle is defined by the second sidewall and the base surface, the first and second corner angles being non-equivalent.

In one aspect the invention encompasses a target construction having a sputtering region and a flange region laterally outward relative to the sputtering region. The flange region has a front surface disposed on a front face of the construction and a back surface opposing the front surface. An o-ring groove is disposed within the flange region. The o-ring groove has a planar base surface which has a first width and has an orifice disposed along the front surface of the flange. The orifice has a second width as measured parallel relative to the base surface. The second width is greater than the first width.

In one aspect the invention encompasses a target having a sputtering region disposed on a front face of the target, and a flange region radially outward (away from the center) relative to the sputtering region. An o-ring groove disposed within the flange region and vent slots extend from the o-ring groove radially inward toward the target center. The vent slot length is less than or equal to 2.3% of the radial distance between the center of the o-ring groove and the center of the target.

BRIEF DESCRIPTION OF THE DRAWINGS

Preferred embodiments of the invention are described below with reference to the following accompanying drawings.

FIGS. 2 and 3 are a diagrammatic view and a cross-sectional view, respectively, of a typical PVD target construction.

FIG. 4 is an enlarged fragmented view of the physical vapor deposition target shown in FIG. 3.

FIG. 5 is a diagrammatic cross-sectional fragmentary view of a target construction in accordance with one aspect of the present invention.

FIG. 6 is a diagrammatic cross-sectional fragmentary view of a target construction in accordance with an alternative aspect relative to FIG. 5.

FIG. 7 is a diagrammatic top view of a protective ring in accordance with one aspect of the invention.

FIG. 23 is an enlarged fragmentary cross-sectional view of a portion of the target construction of FIG. 21.

DETAILED DESCRIPTION OF THE PREFERRED EMBODIMENTS

Figure 1:
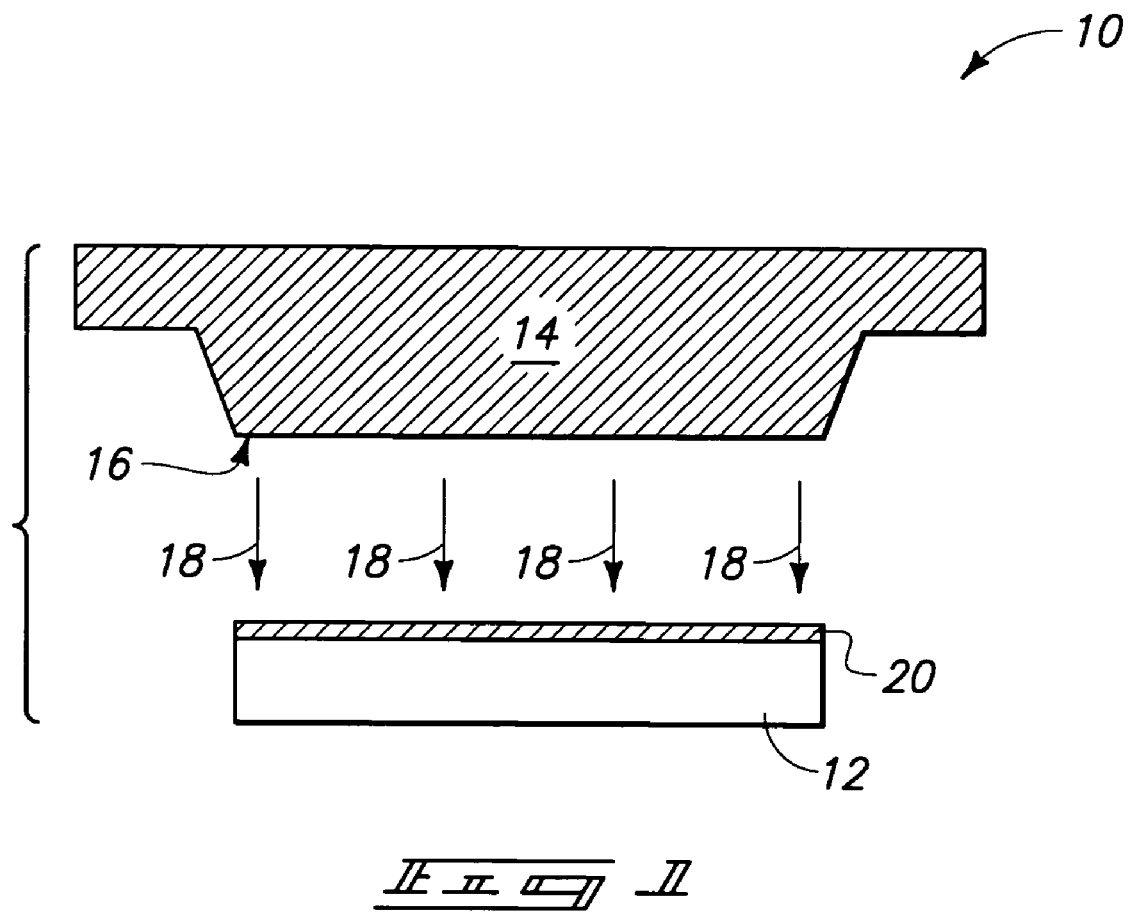
FIG. 1 is a diagrammatic cross-sectional view of a physical vapor deposition system and shows a physical vapor deposition target construction proximate a substrate.

This disclosure of the invention is submitted in furtherance of the constitutional purposes of the U.S. Patent Laws "to promote the progress of science and useful arts" (Article 1, Section 8).

One aspect of the invention is to develop methodology and target configurations to overcome or minimize target rubbing that can occur during sputter deposition. This aspect of the invention is described with reference to FIGS. 5-19. Referring initially to FIG. 5, such shows a side view of target 14 having a flange region 22 configured in accordance with one aspect of the invention. The target of FIG. 5 has features similar to those discussed with respect to the monolithic targets of FIGS. 2-4. Like features are labeled identically with respect to the preceding drawings and modified or new features are denoted by a subscript or a newly assigned unique identifier.

As shown in FIG. 5, a protective material coating 42 can be applied to one or more portions 36, 40 of the front surface of flange region. Coating layer 42 can preferably be a protective coating comprising a protective material which can reduce the coefficient of friction relative to uncoated flange surfaces. In particular instances, the coating 42 can additionally increase local strength.

Exemplary coating materials for coating layer 42 include but are not limited to Teflon or plastic coating materials. Alternatively, coating layer 42 can comprise a layer of metal, ceramic, plastic, Teflon or a combination thereof, coated with an appropriate lubricant having a low coefficient of friction. In particular instances, coating layer 42 can preferably comprise an insulative material. Exemplary insulative materials which can be utilized include, for example, high performance polymers or insulating ceramics having a low coefficient of friction, and can preferably have properties similar to Teflon.

Coating layer 42 can be provided using, for example, direct coating techniques to apply the coating material directly onto surface 40 and surface 36. Alternatively, protective layer 42 can be provided as separate Teflon, plastic or lubricated metal stickers, foils or spacers which can be adhered to the front surface of flange region 22.

Coating 42 is not limited to any particular thickness and can be, for example, from about 0.001 inches to about 0.1 inches. In particular applications and/or particular PVD system configurations, coating layer 42 can preferably have a thickness of about 0.005 inches. However, the thickness of the coating should be less than the-ring clearance to avoid interference of the o-ring seal by the coating layer.

Material 42 can be provided to cover the entire front surface of the flange region as shown in FIG. 5, or can alternatively be provided to cover only a portion of the front surface of the flange region as exemplified in FIG. 6. As illustrated in FIG. 6, a first surface portion 36 can remain uncoated while coating layer 42 is applied over a second surface portion 40 to extend from outer corner 38 of o-ring groove 26 to outer edge 32 of the target construction. Alternatively, coating 42 can be applied over less than an entirety of surface 40 to extend less than the full distance to outer edge 32. For example, coating 42 can extend from corner 38 to opening 24 (not shown).

Coating 42 can be applied to form a continuous ring of coating material around the entire radius of the flange region or can be provided to cover less than an entirety of the radius, such as for example intermittent portions. For instance, coating 42 can be applied intermittently to cover alternate 15 degree radial segments of the flange while intervening 15 degree segments remain non-coated.

The described protective coating can be utilized independently or can be utilized in combination with one or more of the modified contact surface regions and/or decreased volume o-ring channels aspects of the invention described below.

Figure 8:
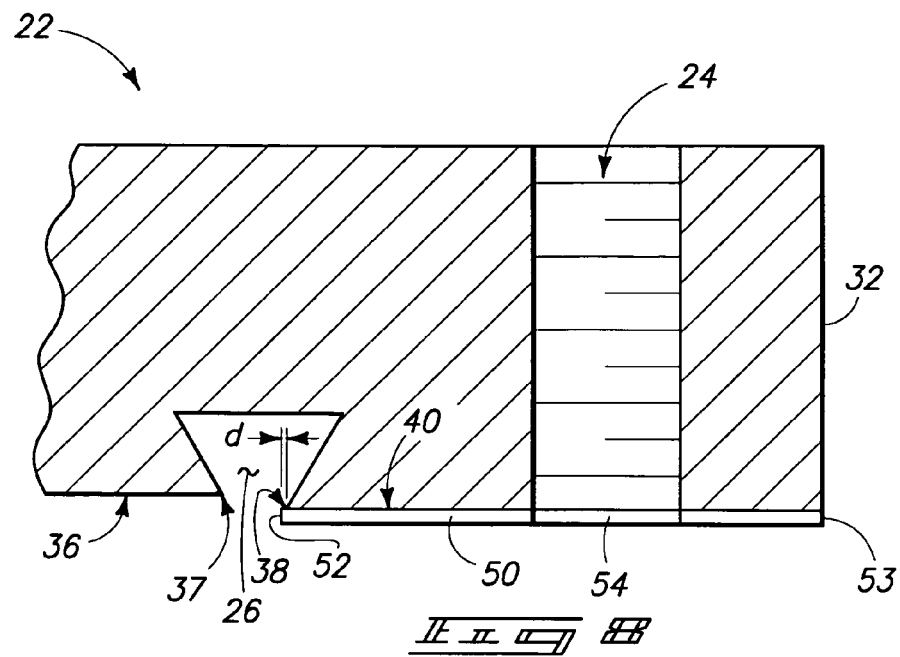
FIG. 8 is a diagrammatic cross-sectional fragmentary view of a target construction incorporating a protective ring in accordance with one aspect of the present invention.

Referring to FIG. 7, such shows an exemplary protective ring 50 which can be utilized as alternative to the coating layer discussed above. Protective ring 50 as depicted in FIG. 7 can be described as being a flat or substantially flat ring of protective material which serves as a spacer between the flange region and interfacing surfaces of a PVD apparatus. Ring 50 can be configured to cover all or a portion of the front surface region of a target flange area in a manner similar to the protective coating discussed above (including radially intermittent covering of the flange region). Ring 50 can have an outer diameter $R_2$ which is equivalent to the outer diameter of the target construction as shown in FIGS. 7 and 8. Alternatively, the protective ring can extend less than an entirety of the distance to the outer edge of a construction and the outer diameter of the ring can be less than the overall diameter of the target construction (not shown).

Protective ring 50 can have an inner radius $R_3$ which can be equivalent to the radius of the sputtering region of a target construction ($R_1$ shown in FIGS. 2 and 3). Alternatively, $R_3$ can be increased to produce a ring which covers less than an entirety of the front surface of a particular flange region. Where a particular target construction is provided with mounting holes, protective ring 50 can be provided to have openings 54 extending therethrough. The number and spacing of openings 54 can preferably be configured to correspond to and align with the mounting holes present in the flange region.

Referring to FIG. 8, such shows an exemplary target construction flange area 22 incorporating a protective ring 50 such as that depicted in FIG. 7. As shown in FIG. 8 protective ring 50 can be provided to at least cover surface 40 extending from outer corner 38 of o-ring groove 26 to target edge 32. Opening 54 can be aligned with mounting hole 24 as shown. In particular applications protective ring 50 can be provided to have an inner diameter surface 52 which overlaps the o-ring groove 26 such as depicted in FIG. 8. An overlap distance 'd' can be defined as the distance between an inner diameter surface 52 of ring 50 and outer corner 38 of the flange region. Distance 'd' is not limited to a particular value and can preferably be selected to allow o-ring insertion into channel 26 and proper o-ring function during physical vapor deposition operations.

Ring 50 is not limited to a particular material and can preferably be, for example, any of the materials discussed above with respect to protective coating 42. Ring 50 can be removable from over flange surface 40, or in particular instances, can be affixed to surface 40 by, for example, an appropriate adhesive material. Ring 50 is not limited to a particular thickness and can be, for example, from about 0.001 inches to about 0.1 inches thick. For particular target constructions, such as for example a 300 mm target design, ring 50 can preferably have a thickness of about 0.005 inches.

Alternative ring configurations which can be utilized to position, stabilize or secure protective ring 50 to a target construction are described with reference to FIGS. 9-11.

Figure 9A:
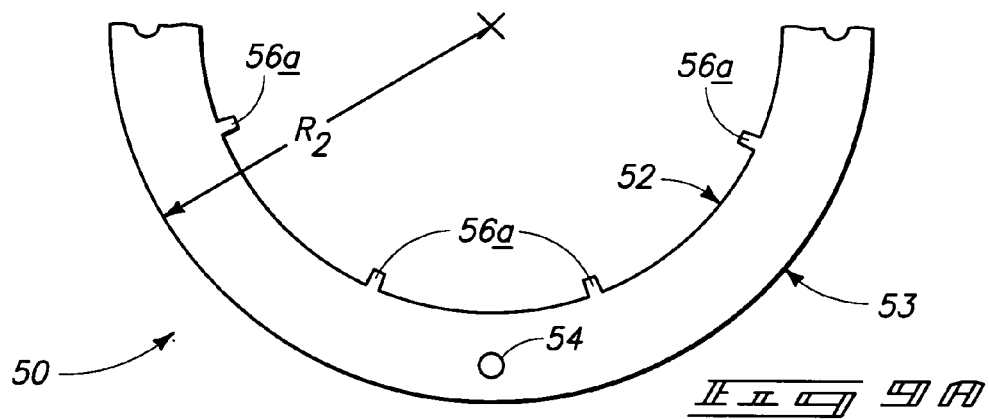
FIG. 9 panels A and B show diagrammatic fragmentary top views of alternative protective ring configurations relative to that shown in FIG. 7.
Figure 9B:
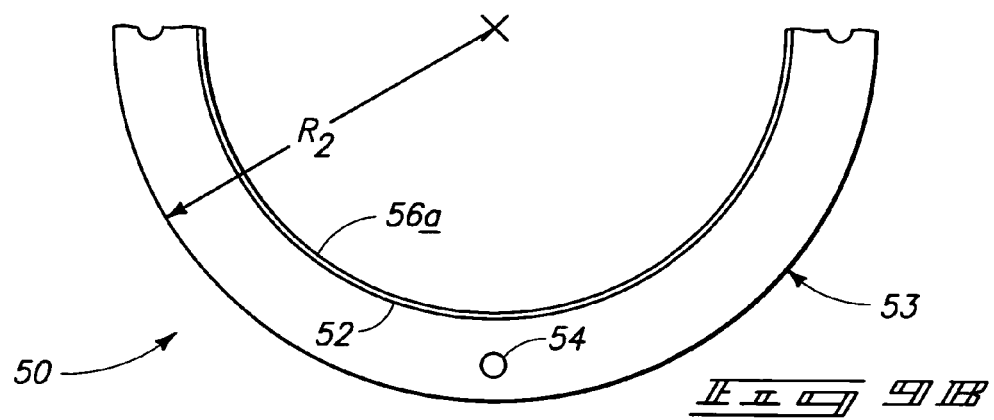

Referring initially to FIG. 9, such shows alternative protective ring configurations 50 having one or more insertable extension portions 56 extending from radial position 52 (corresponding to the inner diameter surface of the exemplary ring shown in FIG. 7). Extension portions 56 can be a single continuous extension 56b as depicted in Panel B, or can alternatively be one or more insertable tab portions 56a as depicted in Panel A. Where a plurality of spaced tabs 56a are utilized, the number of tabs utilized is not limited to a particular number. Tabs 56a can be rectangular or substantially rectangular as shown in panel A or can be any other appropriate shape. The tab size and spacing utilized can vary.

Figure 10:
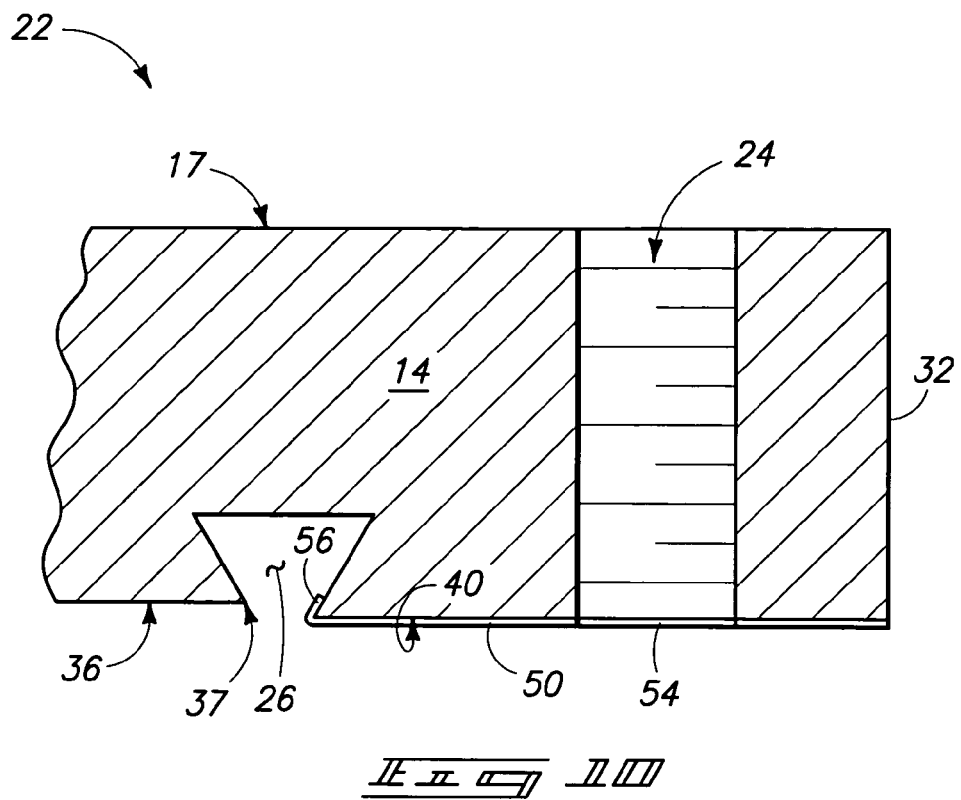
FIG. 10 shows a diagrammatic cross-sectional fragmentary view of a target construction incorporating a protective ring in accordance with FIG. 9.

Extendable portions 56a, 56b can preferably be configured to insert or at least partially insert into the o-ring groove of a target construction such as depicted in FIG. 10. As shown in FIG. 10, extension portion 56 can be configured to bend or fold to allow insertion of the tab or continuous extension region into o-ring channel 26. An o-ring can be provided within channel 26 such that the inserted portion(s) of the protective ring are disposed between the o-ring and a sidewall of the o-ring channel. The length of extension portion 56 is not limited to a particular value and can preferably be a length sufficient to stabilize and/or secure ring 50 over surface 40 without inhibiting or significantly affecting the function of an o-ring housed within opening 26. Additionally, the thickness of the extension portion can be tapered or otherwise varied along the length of the tab or extension to facilitate o-ring insertion. O-ring insertion (not shown) into opening 26 preferably provides enough force against extension 56 to further increase or stabilize ring 50 on the target construction, at least when such construction is mounted within a deposition apparatus.

Figure 11:
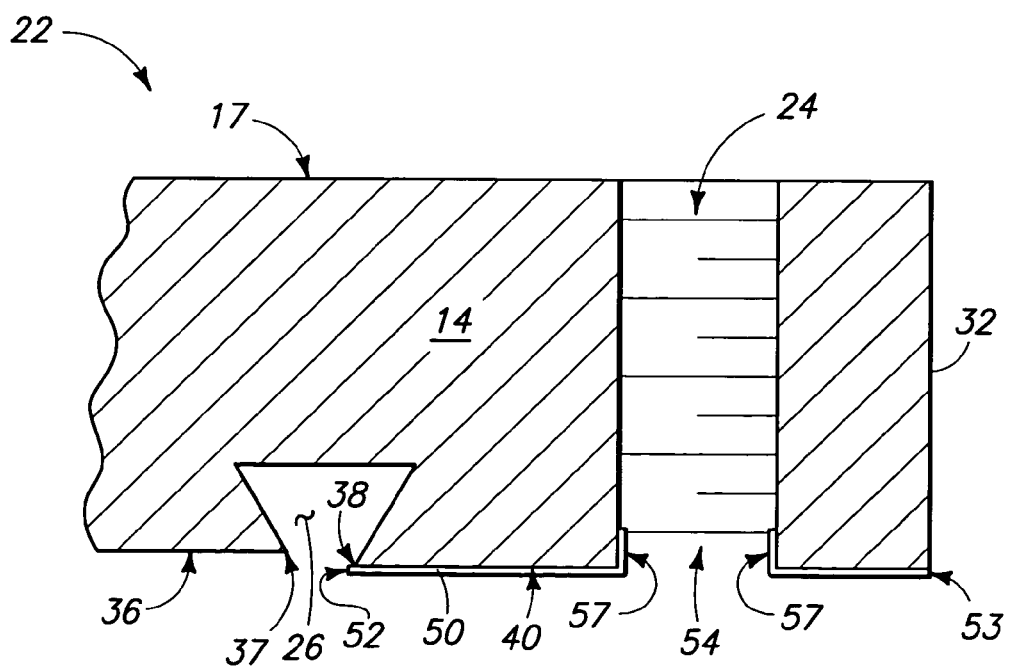
FIG. 11 is a diagrammatic cross-sectional fragmentary view of a target construction and an incorporated protective ring in accordance with an alternative aspect of the invention.

In addition to the extension/insertion configurations discussed above, the invention additionally contemplates utilizing similar extensions 57 (continuous or tabs) within holes 54 which can be insertable into mounting hole 24 as depicted in FIG. 11. Such alternative insertable portions can be used independently or in addition to extension(s) 56 depicted in FIG. 10.

In addition to the flattened ring or sheet type protective ring configurations discussed above, the invention further contemplates alternative ring designs. Such alternative ring or spacer configurations including, for example, washer type or o-ring type configurations.

Alternative appropriate configurations and methodology relative to those discussed above can be utilized to position, stabilize and/or secure protective ring 50 to a target construction in addition or alternatively to those discussed above. Such methods can include, for example, machining or otherwise fabricating a recessed region within a target surface for insertion of protective ring 50. Such recess can preferably be configured to allow the protective ring to effectively space the target surfaces from interfacing apparatus surfaces to minimize detrimental contact and rubbing of the target. Various holders and/or positioning devices can also be utilized, alone or in combination with the configurations discussed above.

For example, a protective ring can be fitted with one or more pins, studs or other fasteners. Appropriate receiving holes can be provided within the flange region to receive the corresponding fastening device.

In addition to the configurations discussed above, the invention contemplates positioning and/or adhering a protective ring over a portion or all of a surface that would otherwise interface a target construction. For example, the protective ring can cover and/or be attached to an interfacing surface of a ceramic ring (discussed above) which interfaces the target construction when mounted within a PVD apparatus (not shown). Exemplary stabilizing and/or securing techniques which can be utilized include those described above with respect to protective rings as applied to target constructions.

Figure 12:
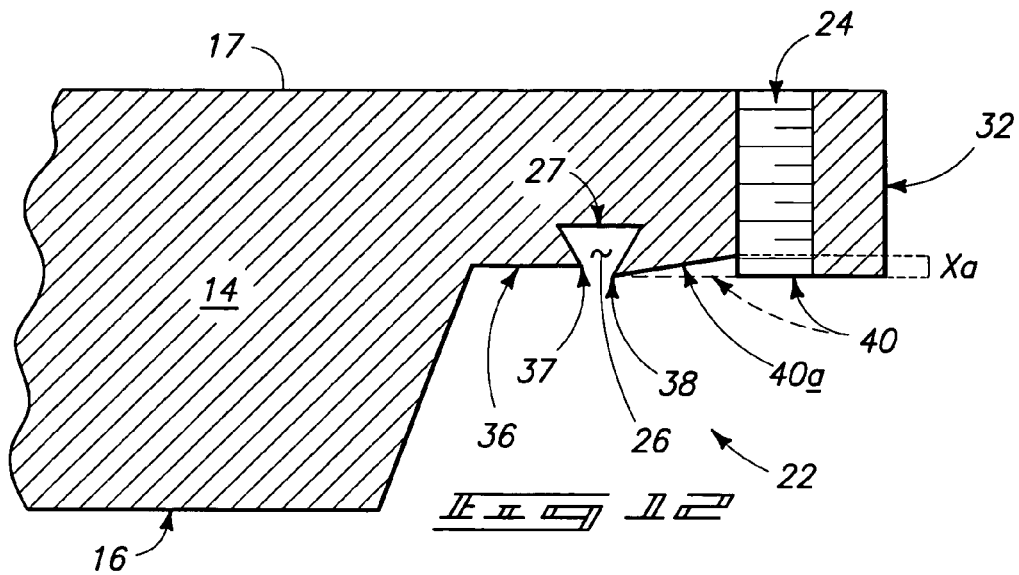
FIG. 12 is a diagrammatic fragmentary cross-sectional view of a target construction in accordance with another aspect of the present invention.

Referring next to FIG. 12, such illustrates an alternative aspect of the invention for minimizing or overcoming target rubbing which can be utilized independently or in addition to the coating or ring/spacer aspects of the invention discussed above.

As shown in FIG. 12, flange region 22 has been modified such that surface 40 has a first portion 40a which is sloped (non-parallel) relative to surface portion 36. Sloped surface portion 40a can be angled relative to surface 36 and imaginary surface 40 shown in dashed lines. The resulting angle between surface 40a and imaginary plane 40 is not limited to a particular value and can be, for example, from about 0.5 degrees to about 5.0 degrees. In particular instances such angle can be, for example, about 1.5 degrees.

An exemplary length of imaginary plane 40 measured from a first point at outside corner 38 of channel 26 to a second point at an intersection with mounting hole 24 can be from about 0.08 to about 0.12 inches. Surface 40a can preferably be sloped such that intersection with mounting hole 24a is measured by $X_a$ as shown, with such measurement corresponding to the maximal elevation of slope surface 40a relative to imaginary plane 40. In particular applications, elevation $X_a$ can be about 0.01 inches. Target flange region depicted in FIG. 12 can be described as being thinner at the second point (intersection of surface 40a and mounting hole 24) by $X_a$ relative to a thickness at the first point (corner 38). In particular instances, flange region 22 can be thinner at the second point than a radial region of the flange comprising surface 36.

As depicted in FIG. 12, the entire surface 40a between corner 38 and the mounting hole can be sloped. It is to be understood that the invention encompasses configurations where one or more portions of the surface remain parallel relative to surface 36, and configurations where various portions of the surface between corner 38 and mounting hole 24 comprise differing slopes relative to one another (not shown). Although sloped surface 40a is depicted as being planar, in some instances, surface 40a or portions thereof can be curved or contoured (not shown).

Sloped surface 40a can be formed, for example, by machining of target 14 either during or after target fabrication.

It can be advantageous to provide a sloped surface such as 40a depicted in FIG. 12 to decrease or minimize contact between flange region 22 and interfacing apparatus surfaces and/or the surface of an intervening ceramic ring. Such decrease in contact can thereby minimize rubbing, target where and/or target contamination.

Figure 13:
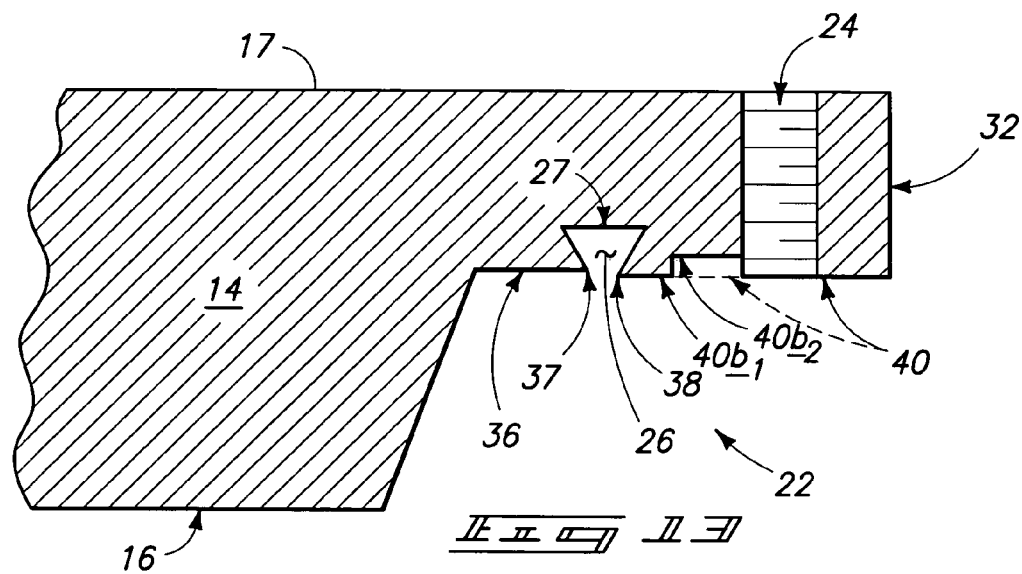
FIG. 13 is a diagrammatic fragmentary cross-sectional view of a target construction in accordance with an alternative aspect of the invention relative to that shown in FIG. 12.

Referring to FIG. 13 such shows an alternative modification of flange region 22 wherein a first portion $40b_1$ of surface 40 retains the original position as in a conventional target, and a second portion $40b_2$ is recessed relative to portion $40b_1$. It is to be understood that the relative surface areas of portion $40b_1$ and $40b_2$ shown in FIG. 13 are exemplary and the invention contemplates any ratio of surface areas of portion $40b_1$ to portion $40b_2$.

Alternatively described, the configuration shown in FIG. 13 has a recess or channel region extending partially between o-ring surface corner 38 and opening 24. The depth of such channels is not limited to a particular value and in can preferably be, for example, less than or equal to about 0.01 inches. The invention further contemplates configurations where rather than the two stepped surfaces illustrated by portion $40b_1$ and $40b_2$, three or more steps are utilized (not shown). Additionally, the invention encompasses configurations where only a portion of surface $40b_2$ is recessed relative to surface $40b_1$ (not shown).

Figure 14:
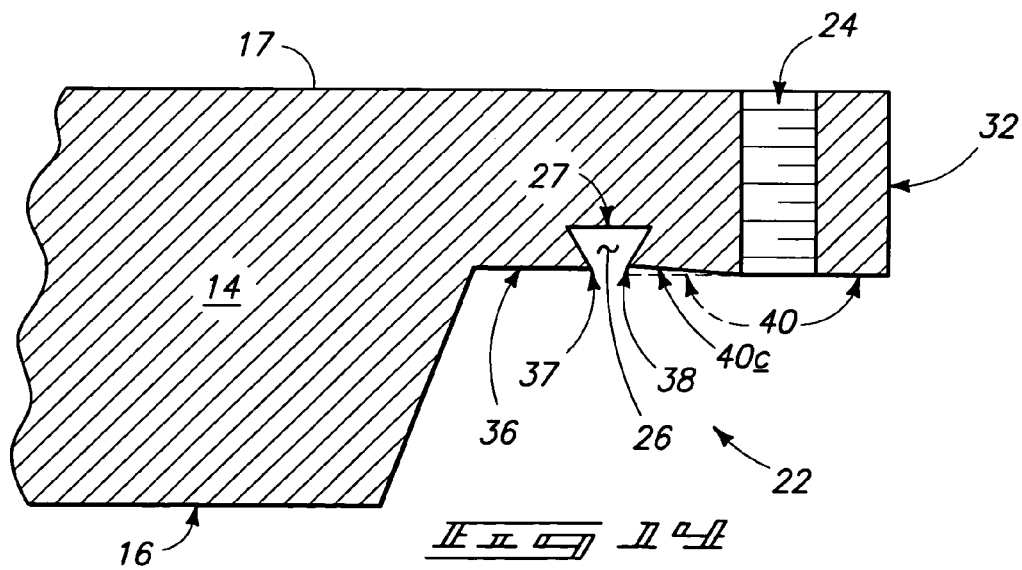
FIG. 14 is a diagrammatic fragmentary cross-sectional view of a target construction in accordance with another alternative aspect of the invention relative to that shown in FIG. 12.

Another alternative target configuration designed to decrease or minimize rubbing within flange region 22 is shown in FIG. 14. As depicted, a sloped surface 40c can be utilized which slopes upwardly away from a point of intersection with mounting hole 24 relative to imaginary plane 40. The slope of surface 40c relative to plane 40 is not limited to any particular value. Additionally, one or more portions of surface 40c can be sloped differently relative to other portions (not shown).

Figure 15:
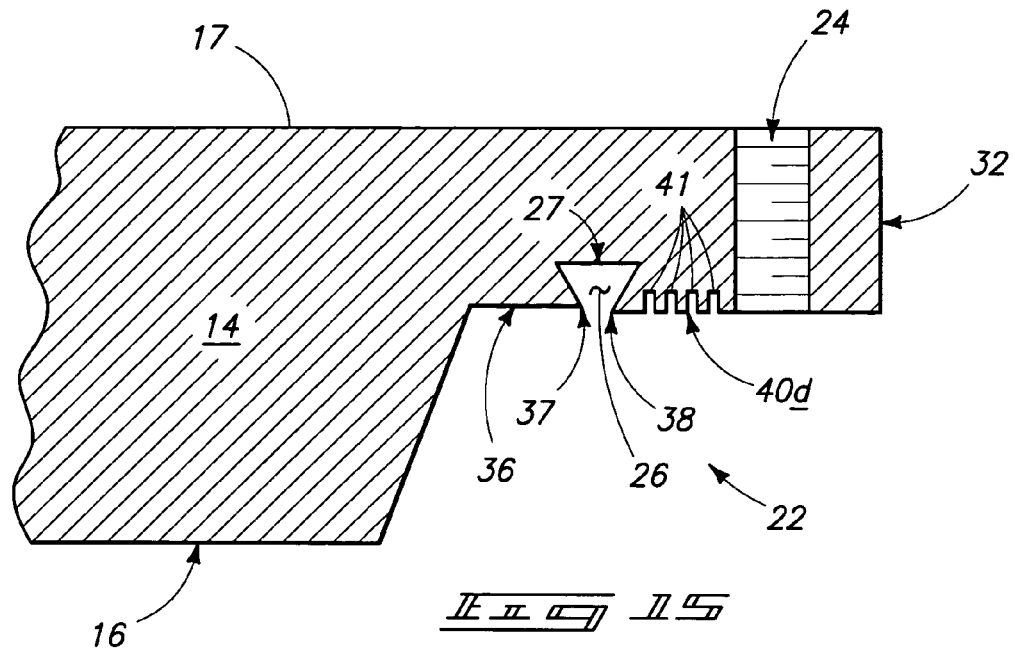
FIG. 15 is a diagrammatic fragmentary cross-sectional view of a target construction in accordance with another alternative aspect of the invention relative to that shown in FIG. 12.

An additional alternative configuration for reducing or minimizing rubbing within flange region 22 is shown in FIG. 15. As illustrated, a series of channels 41 can be provided within a surface region $40_d$. The number of channels 41 can be, for example, four as shown, or can alternatively be fewer than or greater than four (not shown). The depth, width, spacing and aspect ratio of channels 41 are not limited to any particular values. An exemplary depth of channels 41 can be, for example, less than or equal to 0.01 inches.

Figure 16:
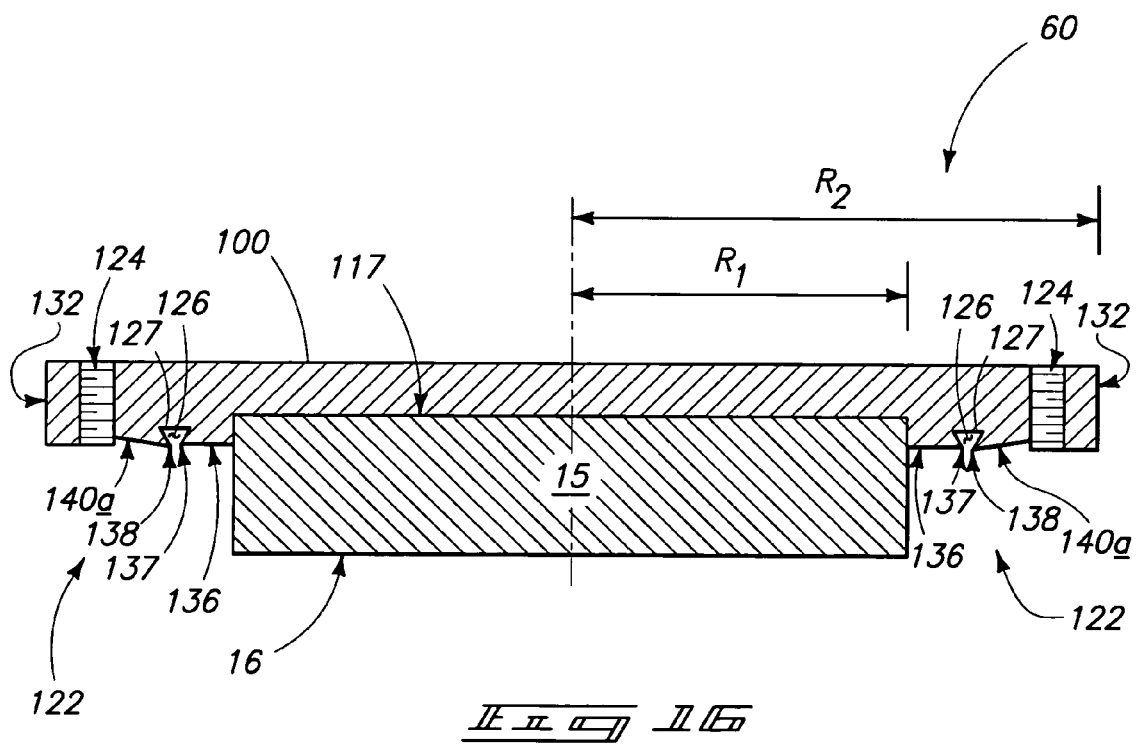
FIG. 16 is a diagrammatic cross-sectional side view of a PVD target/backing plate construction according to one aspect of the present invention.

A additional aspect of reduced target rubbing in accordance with the invention is described with reference to FIG. 16. FIG. 16 illustrates an exemplary target construction comprising target/backing plate assembly 60 in accordance with the invention. Assembly 60 can comprise a target portion 15 and a backing plate portion 100. Assembly 60 has features similar to those discussed with respect to the monolithic targets described above. Like features are labeled similarly with numbering of features occurring in the backing plate of FIG. 16 having numeric identifiers increased by 100 relative to the features of the monolithic targets described in the previous figures.

As shown in FIG. 16, target 15 can physically contact backing plate 100 at an interface line 117. Target 15 can be bonded to backing plate 100 by, for example, diffusion bonding. Alternatively, a bonding material can be present at interface 117 (not shown) which physically joins target 15 to backing plate 100. The invention also contemplates alternative target constructions where target 15 is held to backing plate 100 by alternative methods.

Target assembly 60 shown in FIG. 16 illustrates a flange region 122 present in backing plate 100 which can be utilized for mounting the assembly within a deposition apparatus. The presence or absence and/or positioning of o-ring channel 126 and mounting holes 124 can be as described above with reference to the various described monolithic targets. Flange region 122 of backing plate 100 shown in FIG. 16 incorporates a sloped surface region 140a. Such sloped region can be in accordance with aspects of the monolithic target described with reference to FIG. 12.

Although not specifically depicted, it is to be understood that the invention encompasses embodiments wherein backing plate 100 has flange surface modifications similar to those discussed above for monolithic targets illustrated in FIGS. 13, 14 and 15 as described above. Further, whether or not surface modifications of flange region 122 are present, the protective ring/spacer aspects and/or protective coating aspects discussed above with respect to monolithic targets can also be utilized in conjunction with the target assembly such as or similar to that shown in FIG. 16. Additional aspects of the invention which will be described below with respect to monolithic targets can also be incorporated into target/backing plate assemblies, either independently or in addition to surface modifications and/or protective materials within the flange region.

Figure 17:
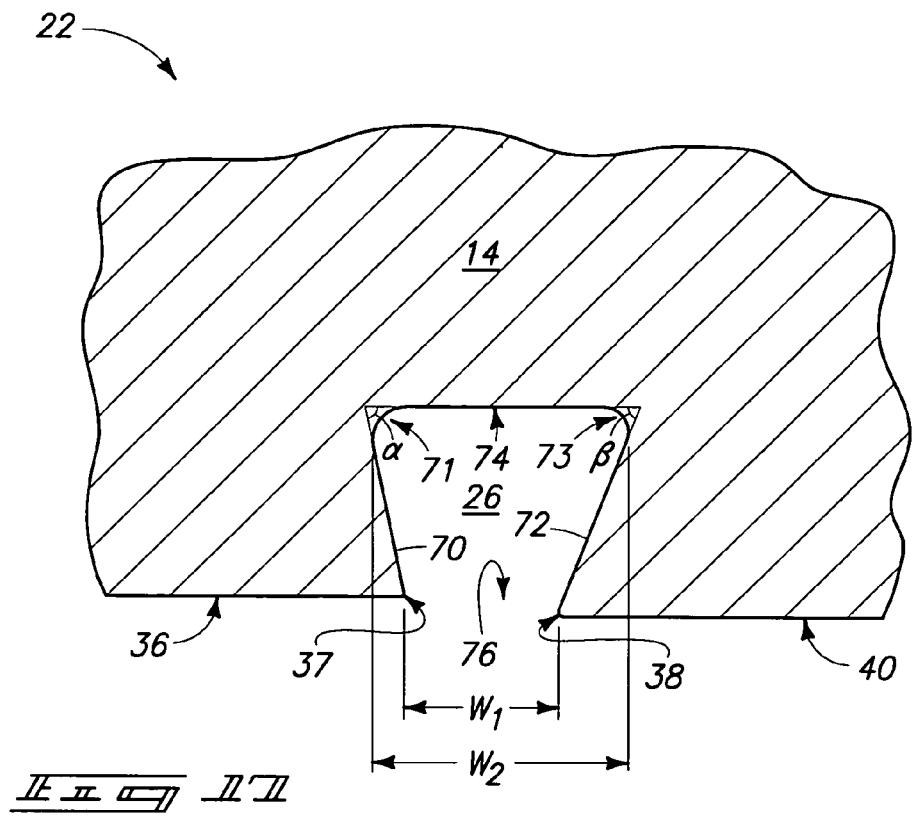
FIG. 17 is a diagrammatic cross-sectional fragmentary view of a target construction in accordance with another aspect of the present invention.

Referring to FIG. 17, such illustrates a distinct aspect of the present invention. It is noted with reference to FIG. 4 that o-ring channel 26 of conventional targets can have an opening base surface 27 which is substantially parallel to flange surface areas 36 and/or 40, and can be parallel to back surface 17. The 0-ring channel shown in FIG. 4 also has internal corners present at the base of the channel of equivalent angle such that the two base corners are mirror images of each other. Turning again to FIG. 17, a flange region 22 is shown having an o-ring channel modified in accordance with the invention. O-ring channel 26 has a first sidewall surface 70, an opposing second sidewall surface 72, and a base surface 74 extending between the first and second sidewall surfaces. An orifice 76 to the channel is provided between flange surfaces 36 and 40. An orifice width $w_1$ is defined as a lateral distance between a first outer corner 38 and a second outer corner 37. Typically, $w_1$ can correspond to a minimum width or channel 26. In particular instances, channel 26 can have a maximum width $w_2$ at or near the base of the opening, as shown.

As shown in FIG. 17, a first base or interior corner 71 present at the intersection between base surface 74 and first sidewall surface 70 is a non-mirror image of a second base or interior corner 73 present at the intersection between base surface 74 and second sidewall surface 72. Alternatively described, a first interior corner angle α is defined by the base surface and a plane corresponding to first sidewall surface 70. A second interior corner angle β is similarly defined by the base surface and second sidewall surface 72. Angles α and β are non-equivalent angles relative to each other. Preferably, first corner 71 has a corner angle α which is larger than opposing angle β. Preferably, the difference between the two angles is produced in order to decrease the volume of the o-ring channel, specifically in the region of the first corner, relative to the configuration shown in FIG. 4.

Although the relative measure of angles α and β is not limited to a particular value, it can be preferable that the volume in the region of corner 71 be sufficiently small to allow increase pressure or squeeze upon the o-ring upon mounting the target in a PVD apparatus. It can be advantageous for example, to decrease the volume of channel 26 relative to conventional channels to increase seal squeeze and thereby minimize contact of metallic flange surfaces with interfacing surfaces comprised by the sputtering apparatus or intervening ceramic ring.

Although FIG. 17 depicts substantially planar sidewalls and substantially planar base surface 74, the invention contemplates adaptation of corner angle modification aspects for utilization with alternative o-ring groove configurations. For example, one or both of the channel sidewalls, or portions thereof can be non-planar, contoured, or otherwise modified relative to the sidewalls depicted. Similarly, alternative corner shaping or contouring can be utilized relative to the substantially smoothly rounded corners depicted in FIG. 17.

Figure 18:
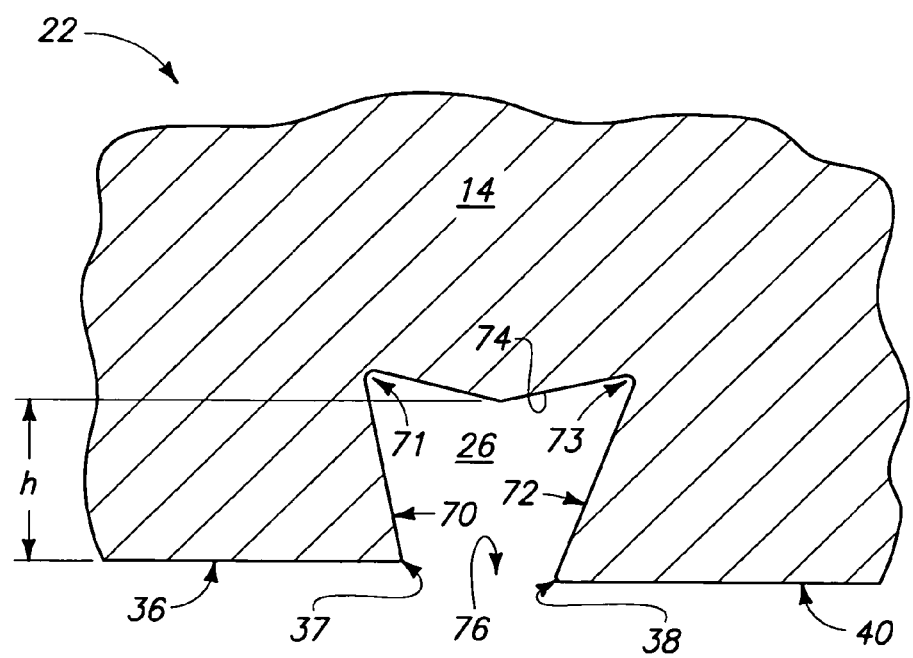
FIG. 18 is a diagrammatic cross-sectional fragmentary view of a target construction in accordance with an alternative aspect of the invention relative to that shown in FIG. 17.
Figure 19:
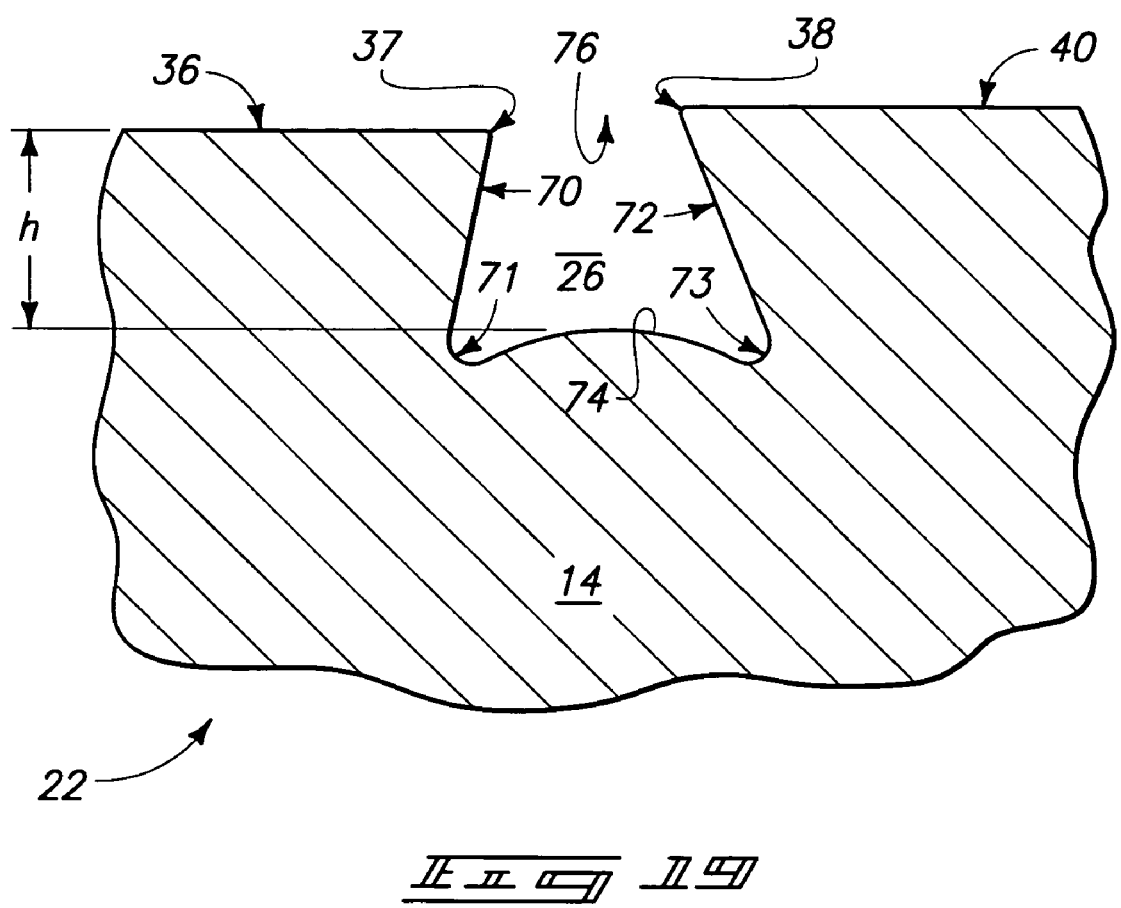
FIG. 19 is a diagrammatic cross-sectional fragmentary view of a target construction in accordance with another alternative aspect of the invention relative to that shown in FIG. 17.
Figure 20:
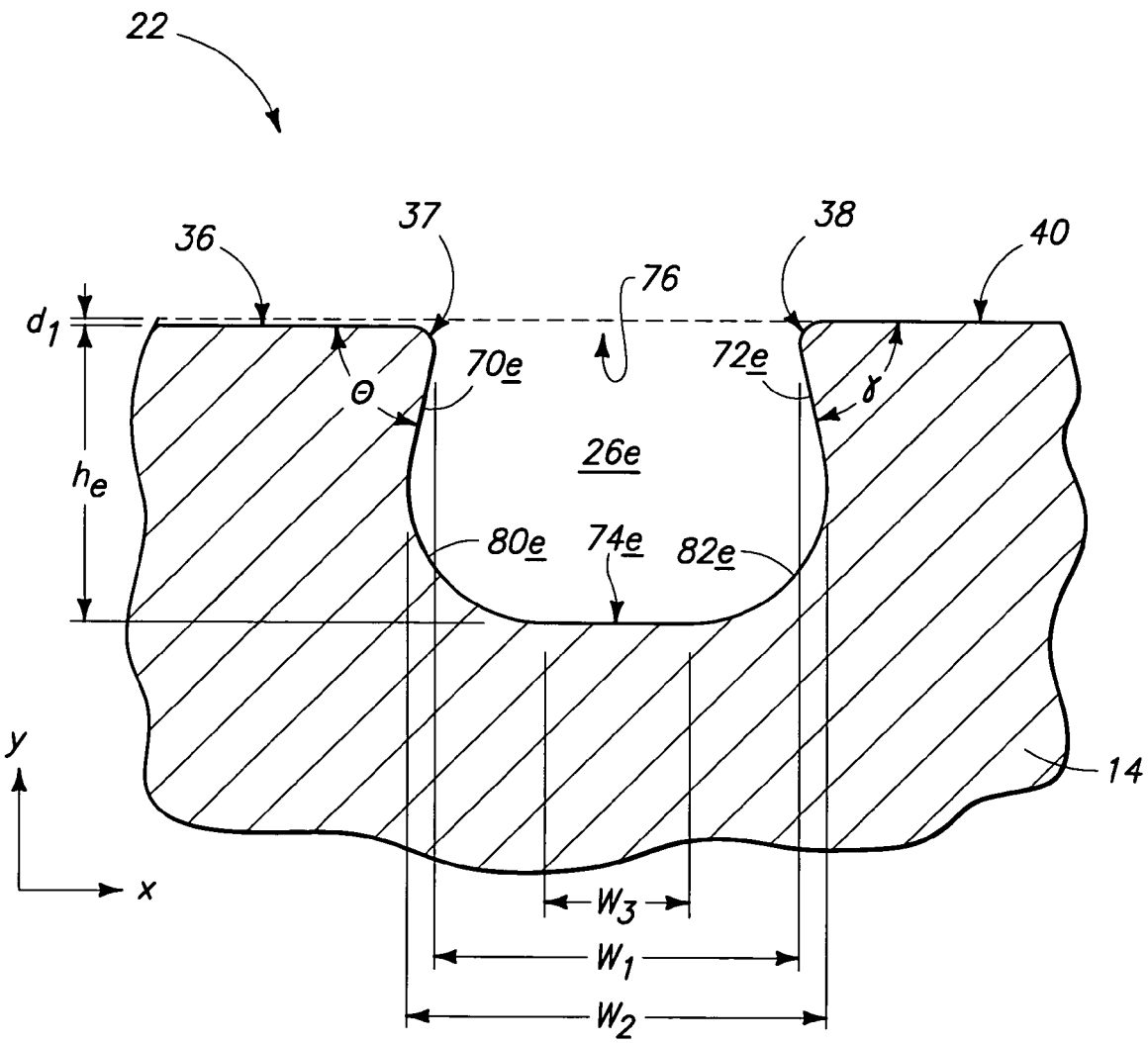
FIG. 20 is a diagrammatic cross-sectional fragmentary view of a target construction in accordance with an additional alternative aspect of the invention.

Alternative o-ring channel configurations to achieve decreased volume and increased seal squeeze in accordance with the invention are exemplified in FIGS. 18, 19 and 20. As shown in FIG. 18, a base surface 74 of channel 26 in accordance with the invention can be non-planar. In other words, a portion of surface 74 can be raised or elevated relative to other portions of surface 74. In preferred aspects, the non-planarity of surface 74 can be configured to decrease the volume of o-ring channel 26 relative to a flat or planar surface such as depicted in FIG. 4. As illustrated in FIG. 18, base surface 74 can comprise two opposingly sloped portions. In particular instance, channel 26 can have a minimum depth 'h' at or near a midpoint of base surface 74 (approximately equidistant from each of corners 71 and 73), with such depth being determined relative to an elevation defined by flange surface 36.

An alternative shape for o-ring groove 26 is shown in FIG. 19. As illustrated, base surface 74 can be contoured or rounded to decrease the volume within the o-ring groove. The channel configuration of FIG. 19 has a minimum depth at or near a midpoint between the two opposing sidewalls similar to that shown in FIG. 18. It is to be understood that the invention contemplates alternative configurations of base surface 74. For example, surface 74 can comprises a planar portion disposed at a minimum height that extend laterally from a midpoint toward one or both of corners 71 and 73 (not shown).

Referring to FIG. 20, such shows an additional o-ring groove configuration which can be particularly useful for inhibiting or avoiding trapped gas or moisture during insertion of an o-ring and/or mounting of the target construction within a physical vapor deposition apparatus. Variations and differences in features relative to earlier described configurations are denoted with an appendant "e" on numeric identifiers, or by a unique numeric identifier. As shown in FIG. 20, sputtering target construction 22 can comprise an o-ring groove 26e disposed within flange region 14. However, as compared to the relatively trapezoidal cross-sectional shapes of the earlier described o-ring grooves, the depicted groove 26e can have a relatively rounded shape. As discussed above, a first portion 36 of front surface of the flange can be parallel with a second region 40 and can be disposed at a different elevation as measured from an opposing back surface of the flange region. The difference in elevation is denoted in FIG. 20 by the indicator '$d_1$'.

O-ring groove 26e can be described as having a depth or height 'h' measured from a planar base surface 74e. As shown, the depth can be measured in a direction parallel to planar base surface 74e extending from the elevation of the base surface to the elevation of surface region 36. Planar base surface 74e can be described as having a first width '$w_3$' which is less than the width '$w_1$' across orifice 76. O-ring groove 26e additionally has a maximum width '$w_2$' measured parallel to planar base surface 74e. The maximum width of the opening is above the level of the base surface at an intermediate elevation with such elevation typically being above the base surface at least about 44% of the depth h.

Figure 22:
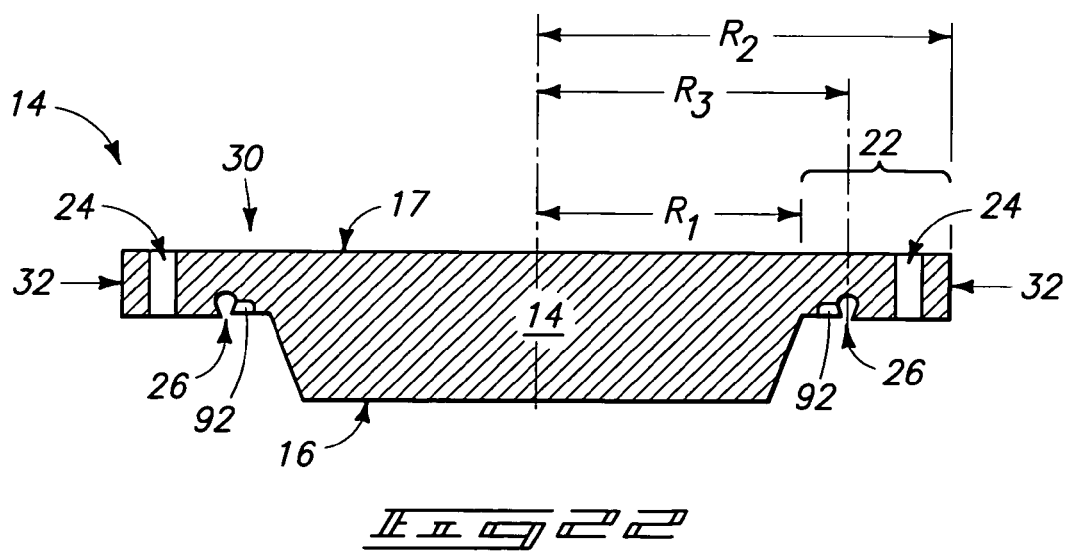
FIG. 22 is a cross-sectional view of the target construction shown in FIG. 21.

O-ring groove 26e can comprise a first planar sidewall surface 70e and an opposing second planar sidewall surface 72e. A first angle '$\theta$' can be described as being defined by flange surface 36 and first planar sidewall surface 70e. A second angle '$\gamma$' can be described as being defined by front flange surface 40 and second planar sidewall surface 72e. Angles $\theta$ and $\gamma$ can be equivalent as depicted in FIG. 22. However it is to be understood that the invention contemplates configurations where $\theta$ and $\gamma$ are nonequivalent.

O-ring groove 26e comprises a first arced surface 80e which extends from a first end of planar surface 24e to an elevation above base surface 74e and can extend to planar surface 70e. On the opposing side of the groove, a second arced surface 82e extends from a second end of planar base surface 74e and can extend to an elevation identical with section 80e or alternatively can extend to a distinct elevation (not shown). As shown arced surface 82e can extend to planar surface 72e. In the configuration depicted in FIG. 20, arced surfaces 80e and 82e are concentric. However, the invention contemplates alternative configurations where the arced sections are non-concentric.

The relatively rounded o-ring groove depicted in FIG. 20 is configured to minimize corner pocket areas present in trapezoidal type configurations. Accordingly, insertion of an o-ring into the o-ring groove and compression of the o-ring during mounting and subsequent operation can provide a more conformal fit of the compressed o-ring to the o-ring groove thereby minimizing or eliminating trapped moisture and gas within the o-ring groove. Such conformal fit can thereby minimize or prevent arcing during deposition to provide decreased surface damage and/or contamination of deposited materials.

Various additional and/or alternative o-ring channel shape modifications can be incorporated to decrease the o-ring volume without departing from the spirit of the invention.

In addition to the flange region configurations discussed above, the invention contemplates utilization of a combination of features of the invention. For example, a flange region can be constructed to have a decreased volume o-ring channel such as described with respect to FIGS. 17-19 and can additionally comprise a sloped, stepped or channeled contact surface area such as any of those described above with respect to FIGS. 12-15. Protective coatings and/or protective rings can be utilized in combination with any of the surface modification and o-ring volumes discussed above.

Many PVD targets have vent slots that extend radially inward from the o-ring groove toward the center of the target. In particular applications utilizing conventional targets, arching can be caused at least in part by the proximity of the central edge of these slots to shielding structures provided with in the PVD apparatus. An aspect of the invention developed to reduce or eliminate this arching is described with reference to FIGS. 21-23.

Figure 21:
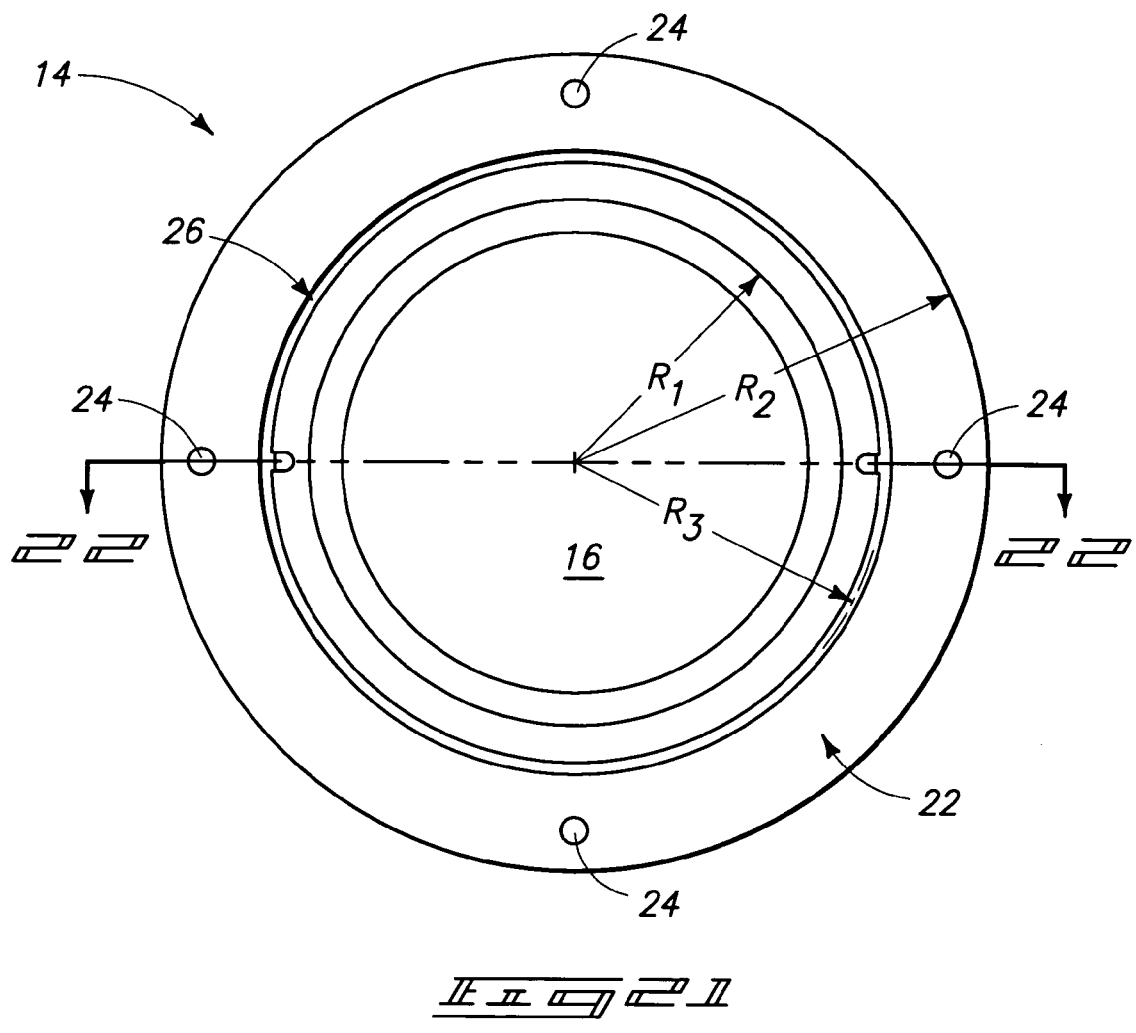
FIG. 21 is a diagrammatic view of a target construction in accordance with a further aspect of the invention.

The target illustrated in FIG. 21 has many features in common with the configurations described above. As additionally illustrated, target 14 can comprise one or more vent slots 92 which extend from the inner edge of o-ring groove 26 toward the center of the target. Although FIG. 21 depicts two such slots, target 14 can have any number of vent slots and preferably from one to 16 vent slots. Slots 92 can be equally spaced radially around the surface of flange 22 or can have alternative spacing. Slots 92 in accordance with the invention extend a relatively short distance from the o-ring groove as compared to conventional vent slots. Specifically, slots 92 can be from 25% to 75% shorter than those present on conventional targets of corresponding size.

Alternatively described, one or more vent shortened vent slots can be present within the flange region of target 14 which extend radially inward from the edge of the o-ring groove as shown in FIG. 22. It is noted that the length of the vent slot and other features depicted in FIG. 22 (and other figures) are not drawn to scale. The length of the vent slot in FIGS. 21-23 is drawn to allow visualization of the concepts of the invention concerning such feature rather than precise size ratios.

FIGS. 22-23 further illustrates shortened vent slot 92. The length of the vent slot is measured from the inner edge of the o-ring orifice (corner 37) toward the center of the target to the point of the slot closest to the target center. The length of the slots is configured maximize the distance between the slot and shielding while being sufficient to provide venting action.

The length can preferably be from about 1% to about 3% of a distance $R_3$ measured along the target radius between the center of the target to the mid-point 'M' of the o-ring channel orifice. In certain applications, a preferred vent slot length can be about 2.3% of $R_3$. The shortened vent slot length can advantageously provide a greater distance between the slot and shielding structures relative to conventional vent slot configurations. Accordingly, the decreased proximity decreases or eliminates proximately arching effects.

Vent slots 92 are not limited to any particular shape, width or depth. In particular applications, the vent slots can be configured to have slot cross-sectional shapes, depths and widths similar or identical to conventional configurations, with only the length being varied. However, the invention additionally contemplates alternative shapes, depths and widths.

The shortened vent slot aspects of the invention can be utilized in conjunction with any of the additional features of the invention described above. The shortened vent slot concepts can also be adapted for utilization with conventional target configurations and configurations yet to be developed.

Although the invention is described with reference to planar circular targets, the invention concepts are equally applicable to other target geometries. The described inventive target features can advantageously reduce contact rubbing that occurs between targets or target assemblies and the interfacing apparatus surfaces. Target configurations and surface protection methodology of the invention can reduce or eliminate particle generation caused by rubbing and reduce or eliminate arching. Utilization of targets in accordance with the invention can preserve expensive ceramic o-rings and/or apparatus surfaces, decrease or prevent target contamination and can result in increased film quality and reproducibility.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A sputtering target construction comprising:
    a sputtering region comprising a sputtering surface disposed on a front face of the construction;
    a flange region laterally outward relative to the sputtering region; the flange region having a front surface disposed on the front face of the construction, a back surface opposing the front surface, and a coefficient of friction;
    a protective material over at least a portion of the front surface of the flange, wherein the coefficient of friction is reduced relative to uncoated flange surfaces; and
    an o-ring groove disposed within the flange region, the o-ring groove comprising:
        a planar base surface having a first width; and
        an orifice disposed along the front surface, the orifice having a second width measured parallel relative to the base surface, the second width being greater than the first width.

2. The sputtering target construction of claim 1 wherein the o-ring groove further comprises a first planar sidewall surface and an opposing second planar sidewall surface.

3. The sputtering target construction of claim 2 wherein the front surface of the flange region comprises a first planar region disposed on a first side of the orifice at a first elevation relative to the back surface, and a second planar region disposed on a second side of the orifice at a second elevation relative to the back surface.

4. The sputtering target construction of claim 3 wherein a first angle defined by the first planar region of the front surface and the first planar surface of the o-ring groove is equivalent to a second angle defined by the second planar region of the front surface and the second planar surface of the o-ring groove.

5. The sputtering target construction of claim 1 wherein the o-ring groove comprises a first arced surface extending from a first end of the planar base surface and a second arced surface extending from a second end of the planar base surface, each of the first and second arced surfaces extending to an elevation above the base surface.

6. The sputtering target of claim 5 wherein the elevation is above the base surface by a distance greater than or equal to 50% of a depth of the o-ring groove, the depth being defined by the distance between the planar base surface and the front surface measured parallel to the planar base surface.

7. The sputtering target of claim 5 wherein the first and second arced surfaces are concyclic.

8. The sputtering target of claim 5 wherein the elevation is a first elevation and wherein the o-ring groove has a maximum width disposed at a second elevation above the base surface, the maximum width being measured parallel to the planar base surface.

9. The sputtering target of claim 6 wherein the second elevation is less than the first elevation.

10. The sputtering target of claim 8 wherein the maximum width is greater than the second width.

11. The target construction of claim 1 wherein the protective material comprises at least one member of the group consisting of Teflon, ceramic, plastic, lubricant-coated Teflon, lubricant-coated plastic, lubricant-coated ceramic, lubricant-coated metal, and combinations thereof.

12. The target construction of claim 1 wherein the protective material is a protective ring configured to cover an entirety of a radial surface region of the flange extending from the o-ring groove to a mounting bolt opening present in the flange region.

13. The target construction of claim 1 wherein the target construction is monolithic.

14. The target construction of claim 1 comprising a backing plate, wherein the flange region is comprised by the backing plate.

15. The target construction of claim 1 further comprising at least one vent slot having a slot length extending from the o-ring groove toward the target center, the slot length being from 1% to 3% of a distance measured along the target radius between the target center and a midpoint of the o-ring groove.

16. A sputtering target construction comprising:
    a sputtering region comprising a sputtering surface disposed on a front face of the construction, the sputtering region extending from a central point to a first radial position;
    a flange region extending from the first radial position laterally outward relative to the sputtering region; the flange region having a front surface disposed on the front face of the construction, a back surface opposing the front surface, and a coefficient of friction;

a protective material over at least a portion of the front surface of the flange, wherein the coefficient of friction is reduced relative to uncoated flange surfaces; and an o-ring groove disposed within the front surface of the flange region, the o-ring groove having an orifice at the front surface with an orifice midpoint being disposed at a third radial position; and a vent slot extending from the o-ring groove toward the center of the target, the vent slot having a length of from 1% to 3% of the distance between the target center and the third radial position.

17. The target of claim 16 wherein the length of the vent slot is 2.3% of the distance between the target center and the third radial position.

* * * * *

UNITED STATES PATENT AND TRADEMARK OFFICE
CERTIFICATE OF CORRECTION

| | | |
|---|---|---|
| PATENT NO. | : 7,618,520 B2 | Page 1 of 1 |
| APPLICATION NO. | : 11/234615 | |
| DATED | : November 17, 2009 | |
| INVENTOR(S) | : Wu et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 709 days.

Signed and Sealed this

Twenty-sixth Day of October, 2010

David J. Kappos
*Director of the United States Patent and Trademark Office*